United States Patent
Morikawa et al.

(10) Patent No.: US 10,554,064 B2
(45) Date of Patent: Feb. 4, 2020

(54) BATTERY CONTROLLING DEVICE

(71) Applicant: Hitachi Automotive Systems, Ltd., Hitachinaka-shi, Ibaraki (JP)

(72) Inventors: Hiroshi Morikawa, Hitachinaka (JP); Yoshinori Aoshima, Hitachinaka (JP); Masashi Naitoh, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/230,384

(22) Filed: Dec. 21, 2018

(65) Prior Publication Data

US 2019/0123571 A1 Apr. 25, 2019

Related U.S. Application Data

(63) Continuation of application No. 15/321,243, filed as application No. PCT/JP2015/068325 on Jun. 25, 2015, now Pat. No. 10,205,333.

(30) Foreign Application Priority Data

Jul. 7, 2014 (JP) ................... 2014-139436

(51) Int. Cl.
*H02J 7/00* (2006.01)
*G01R 31/36* (2019.01)
(Continued)

(52) U.S. Cl.
CPC ............ *H02J 7/0068* (2013.01); *B60L 58/10* (2019.02); *G01R 31/36* (2013.01);
(Continued)

(58) Field of Classification Search
CPC ........................................................ H02J 7/00
(Continued)

(56) References Cited

U.S. PATENT DOCUMENTS

2010/0241376 A1* 9/2010 Kikuchi ................. B60K 6/445
702/63
2011/0084702 A1* 4/2011 Mori .................... H01M 10/441
324/430
(Continued)

FOREIGN PATENT DOCUMENTS

EP 2 131 440 A1 12/2009
JP 2006-337155 A 12/2006
(Continued)

OTHER PUBLICATIONS

International Search Report (PCT/ISA/210) issued in PCT Application No. PCT/JP2015/068325 dated Aug. 18, 2015 with English translation (Four (4) pages).
(Continued)

*Primary Examiner* — Edward Tso
*Assistant Examiner* — Ahmed H Omar
(74) *Attorney, Agent, or Firm* — Crowell & Moring LLP

(57) ABSTRACT

A battery controlling device includes: a voltage detecting unit configured to detect a closed-circuit voltage of a secondary battery; an open-circuit-voltage computing unit configured to compute an open-circuit voltage of the secondary battery; and an assembled-battery controlling unit configured to discriminate whether a computed value computed based on a voltage difference between the closed-circuit voltage and the open-circuit voltage of the secondary battery in a continuous predetermined period is exceeding a permissible value determined in advance or not. If the computed value is exceeding the permissible value determined in advance, the assembled-battery controlling unit outputs a signal that carries out charge/discharge restriction of the secondary battery.

8 Claims, 8 Drawing Sheets

(51) Int. Cl.
  *H01M 10/44* (2006.01)
  *H01M 10/48* (2006.01)
  *H01M 10/42* (2006.01)
  *B60L 58/10* (2019.01)

(52) U.S. Cl.
  CPC ......... *H01M 10/425* (2013.01); *H01M 10/44* (2013.01); *H01M 10/441* (2013.01); *H01M 10/48* (2013.01); *H01M 10/482* (2013.01); *H02J 7/00* (2013.01); *H02J 7/007* (2013.01); *H01M 2220/20* (2013.01); *Y02T 10/705* (2013.01); *Y02T 10/7005* (2013.01)

(58) Field of Classification Search
  USPC .......................................................... 320/128
  See application file for complete search history.

(56) References Cited

U.S. PATENT DOCUMENTS

| | | |
|---|---|---|
| 2011/0279088 A1 | 11/2011 | Yamamoto et al. |
| 2016/0229411 A1* | 8/2016 | Murata .................. B60L 58/12 |

FOREIGN PATENT DOCUMENTS

| | | |
|---|---|---|
| JP | 4494453 B2 | 6/2010 |
| JP | 2011-103291 A | 5/2011 |
| JP | 2012-49040 A | 3/2012 |
| JP | 2013-143206 A | 7/2013 |
| WO | WO 2011/074196 A1 | 6/2011 |
| WO | WO 2014/054368 A1 | 4/2014 |

OTHER PUBLICATIONS

Japanese-language Written Opinion (PCT/ISA/237) issued in PCT Application No. PCT/JP2015/068325 dated Aug. 18, 2015 (Three (3) pages).

Extended European Search Report issued in counterpart European Application No. 15818972.0 dated Jan. 31, 2018 (seven pages).

\* cited by examiner

BATTERY CONTROLLING DEVICE

CROSS REVERENCE

This application is continuation of U.S. application Ser. No. 15/321,243, filed Feb. 22, 2016, which is a National Stage of PCT International Application No. PCT/JP2015/068325, filed Jun. 25, 2015, which claims priority from Japanese Patent Application No. 2014-139436, filed on Jul. 7, 2014, the disclosures of which are expressly incorporated by reference herein.

TECHNICAL FIELD

The present invention relates to a battery controlling device that controls charge/discharge of a secondary battery.

BACKGROUND ART

Secondary batteries used in vehicle-mounting uses, etc. are expected to be used with high currents. If a secondary battery such as a lithium-ion battery is subjected to continuous charge/discharge with a high current for a long period of time, an internal resistance value is increased, performance is deteriorated, and the performance originally possessed by the secondary battery cannot be fully exerted. Therefore, in order to prevent such performance deterioration, PTL 1 discloses a battery controlling method that accumulates evaluation values, which indicate the deterioration degree of a battery caused by continuance of discharge of the battery, and, if the accumulated value thereof exceeds a predetermined permissible value, restricts discharge of the battery.

In the battery controlling method disclosed in this PTL 1, whether the electric power is to be restricted or not is determined by estimating changes in unevenness of the ion concentration in electrolyte of the secondary battery based on the history of charge/discharge currents. In order to estimate the unevenness of the ion concentration, parameters such as currents and the temperature of the battery have to be used. It is general to acquire the temperature of the battery by attaching a thermocouple or a thermistor to a surface of the battery, and it is extremely difficult to precisely measure the temperature in the vicinity of an electrolysis solution or an electrode directly related to unevenness of ions. In a steady state with no temperature changes, differences among measurement locations do not cause big problems since the surface temperature of the battery and the temperature in the battery are equal. However, if the temperature is changed due to heat generation of the battery caused by charge/discharge, a cooling medium, or a cooling wind, a temperature difference is caused between the inside and outside the battery, and it becomes difficult to precisely estimate the temperature in the battery. As a result, the charge/discharge of the battery may be excessively restricted due to the difference between a measured value of the battery temperature and the actual temperature in the battery, or charge/discharge may not be appropriately restricted, which may lead to resistance increase and unsatisfaction of an expected life.

CITATION LIST

Patent Literature

PTL 1: JP 4494453 B2

SUMMARY OF INVENTION

Technical Problem

If the method described in above described PTL 1 is used, deterioration of the performance of the secondary battery cannot be reliably prevented under the conditions in which the temperature is largely changed during usage of the secondary battery.

Solution to Problem

According to a first aspect of the present invention, a battery controlling device includes: a voltage detecting unit configured to detect a closed-circuit voltage of a secondary battery; an open-circuit-voltage computing unit configured to compute an open-circuit voltage of the secondary battery; and an assembled-battery controlling unit configured to discriminate whether a computed value computed based on a voltage difference between the closed-circuit voltage and the open-circuit voltage of the secondary battery in a continuous predetermined period is exceeding a permissible value determined in advance or not, wherein, if the computed value is exceeding the permissible value determined in advance, the assembled-battery controlling unit outputs a signal that carries out charge/discharge restriction of the secondary battery.

Advantageous Effects of Invention

According to the present invention, deterioration of the performance of the secondary battery can be reliably prevented even in a case in which the temperature is largely changed during usage of the secondary battery.

DESCRIPTION OF EMBODIMENT

Hereinafter, an embodiment of the present invention will be described based on drawings. In the following embodiment, a case in which the present invention is applied to a battery system, which constitutes an electric power source of a hybrid vehicle (HEV), is taken as an example for description.

Moreover, in the following embodiment, a case in which a lithium-ion battery is employed as a secondary battery is taken as an example for description. However, other than that, a nickel-hydrogen battery, a lead battery, an electric double-layer capacitor, a hybrid capacitor, etc. can be used. Note that, in the following embodiment, an assembled battery is formed by serially connecting single batteries. However, an assembled battery may be formed by serially connecting parallelly-connected single batteries, or an assembled battery may be formed by parallelly connecting serially-connected single batteries.

Figure 1:
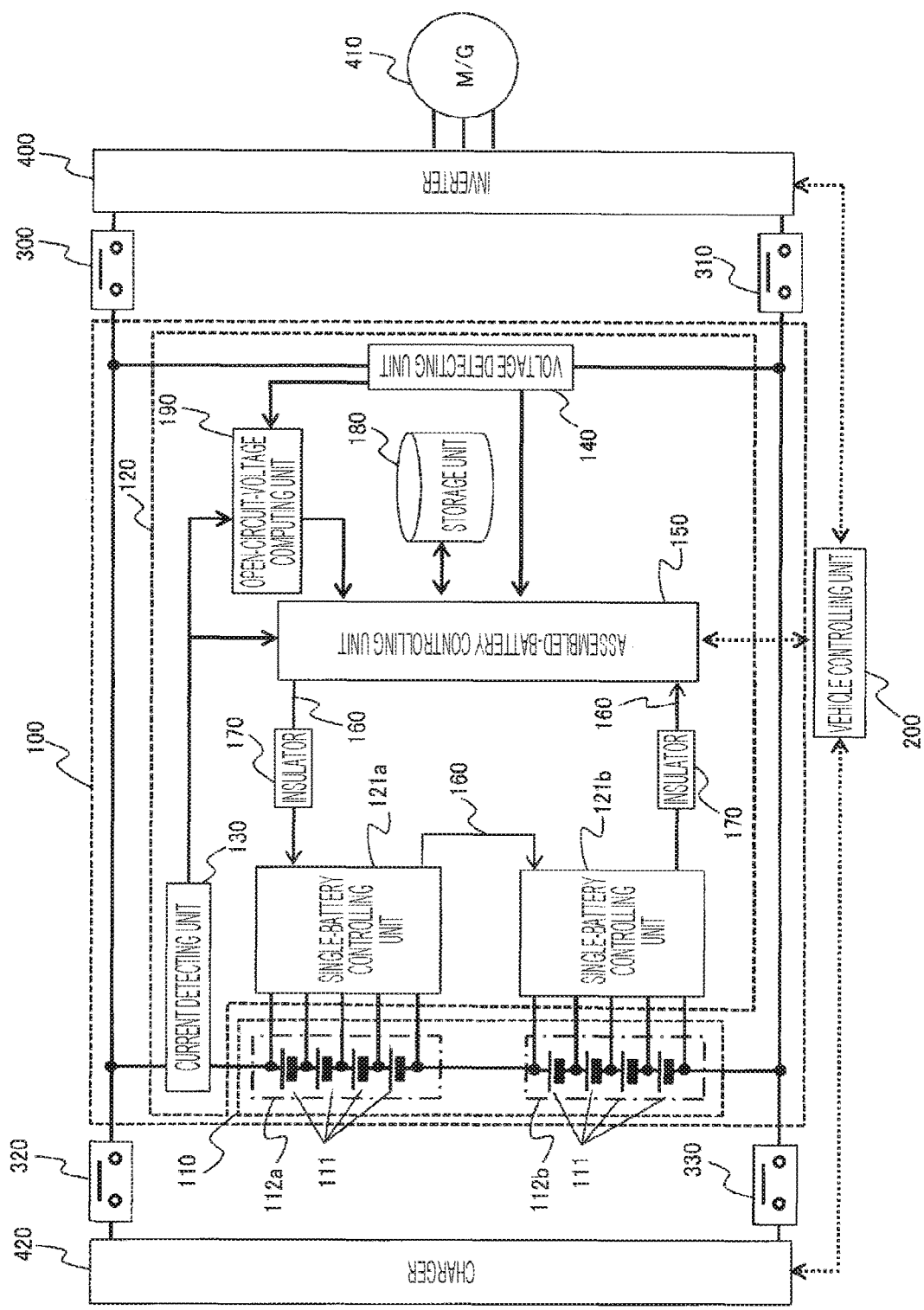
FIG. 1 is a diagram showing a battery system and a configuration therearound.

FIG. 1 is a block diagram showing a battery system 100 according to the embodiment of the present invention and a circuit configuration therearound. The battery system 100 is connected to a vehicle controlling unit 200, and the vehicle controlling unit 200 controls relays 300 and 310 to connect the battery system 100 to an inverter 400. Furthermore, the vehicle controlling unit 200 controls relays 320 and 330 to connect the battery system 100 to a charger 420.

The battery system 100 is provided with an assembled battery 110 and a battery controlling device 120. The assembled battery 110, which is a secondary battery, is formed by electrically serially connecting a plurality of single batteries 111, which can accumulate and discharge electric energy (charge/discharge of direct-current electric power). The single batteries 111 constituting the assembled battery 110 are grouped by predetermined unit numbers for carrying out management or control of the state of charge/discharge. The grouped single batteries 111 are electrically serially connected and constitute single-battery groups 112a and 112b. The numbers of the single batteries 111 constituting the single-battery groups 112a and 112b may be the same numbers in all the single-battery groups 112a and 112b, or the numbers of the single batteries 111 may be different respectively in the single-battery groups 112a and 112b. In the present embodiment, in order to simplify description, the single-battery groups 112a and 112b are constituted by electrically serially connecting four single batteries 111 for each of them, and the assembled battery 110 provided with in total 8 single batteries 111 is formed by further electrically serially connecting the single-battery groups 112a and 112b.

The battery controlling device 120 is provided with: single-battery controlling units 121a and 121b, a current detecting unit 130, a voltage detecting unit 140, an assembled-battery controlling unit 150, a storage unit 180, an open-circuit-voltage computing unit 190.

The single-battery controlling units 121a and 121b are connected to the single-battery groups 112a and 112b, respectively, detect battery voltages (both-end voltages) and temperatures of the single batteries 111 constituting these single-battery groups, and transmit signals indicating detection results thereof to the assembled-battery controlling unit 150 via signal communication paths 160 and an insulating element 170. Note that, for example, a photo coupler is used as the insulating element 170.

The current detecting unit 130 detects the current flowing to the assembled battery 110 and measures the current value thereof. The voltage detecting unit 140 detects the both-end voltage of the assembled battery 110, in other words, the voltage of the single batteries 111 serially connected in the assembled battery 110. Then, the voltage detecting unit 140 detects the voltage of a period in which the current is flowing to the assembled battery 110 as a closed-circuit voltage.

The assembled-battery controlling unit 150 is constituted by, for example, a microcomputer and acquires information of the battery voltages, temperatures, and charge levels of the single batteries 111 based on the signals transmitted from the single-battery controlling units 121a and 121b. Moreover, the assembled-battery controlling unit 150 receives the value of the current, which flows to the assembled battery 110, from the current detecting unit 130 and receives the total voltage value of the assembled battery 110 from the voltage detecting unit 140. The received information is stored in the storage unit 180. Based on this information, the assembled-battery controlling unit 150 detects the state of the assembled battery 110. The results of the state detection of the assembled battery 110 by the assembled-battery controlling unit 150 are transmitted to the single-battery controlling units 121a, 121b and the vehicle controlling unit 200.

Herein, a method of communication between the assembled-battery controlling unit 150 and the single-battery controlling units 121a and 121b will be described. The single-battery controlling units 121a and 121b are serially connected in the descending order of the electric potentials of the single-battery groups 112a and 112b respectively monitored by them. The signals transmitted from the assembled-battery controlling unit 150 are input to the single-battery controlling unit 121a via an insulating element 170 and a signal communication path 160. The output of the single-battery controlling unit 121a is input to the single-battery controlling unit 121b via the signal communication path 160. The output of the single-battery controlling unit 121b, which is at a lowest level, is transmitted to the assembled-battery controlling unit 150 via the insulating element 170 and the signal communication path 160. Note that, in the present embodiment, an insulating element is not provided between the single-battery controlling unit 121a and the single-battery controlling unit 121b. However, signals can be transmitted/received therebetween via an insulating element.

In the storage unit 180, various information required for the assembled-battery controlling unit 150 to control the assembled battery 110 is memorized and stored. For example, the information about the charge levels of the single batteries 111, the information about the internal resistances of the single batteries 111, etc. is stored in the storage unit 180.

The open-circuit-voltage computing unit 190 detects the current, which flows to the assembled battery 110, from the current detecting unit 130, receives the information of voltage, etc. from the voltage detecting unit 140, detects the voltage of the period in which the current is not flowing by the voltage detecting unit 140, and sets that as an open-circuit voltage. Alternatively, the relation between the charge level and the open-circuit voltage of the assembled battery 110 is stored in advance in the storage unit 180 as a table or a function, the open-circuit voltage corresponding to the detected charge level is read from the storage unit 180, and an open-circuit voltage is obtained based on the detected charge level. The open-circuit voltage is preferred to be sequentially updated based on the information of the charge level. However, the voltage from the voltage detecting unit 140 in the period in which the current is not flowing may be stored, and this voltage may be used as an open-circuit voltage during a charge/discharge period. Note that the charge level is synonymous with SOC (State of Charge) of the assembled battery 110 and is also referred to as a charge rate.

The assembled-battery controlling unit 150 executes various processes and computations for controlling the assembled battery 110 by using the information received from the single-battery controlling units 121a and 121b, the current detecting unit 130, the voltage detecting unit 140, the open-circuit-voltage computing unit 190, and the vehicle controlling unit 200 and the information, etc. stored in the storage unit 180. For example, when a current is flowing to the assembled battery 110 according to the current detecting unit 130, the voltage is detected by the voltage detecting unit 140 and is set as a closed-circuit voltage. The open-circuit voltage of the period in which the current is not flowing is acquired by the open-circuit-voltage computing unit 190. Then, based on the voltage difference between the closed-circuit voltage and the open-circuit voltage, a later-described ΔV effective value or the like is computed, and the computed value thereof is used as an index value. Whether or not this index value is exceeding a predetermined permissible value stored in the storage unit 180 is discriminated. If the index value is exceeding the predetermined permissible value, a signal for carrying out charge/discharge restriction of the secondary battery is output to the vehicle controlling unit 200. Note that the assembled-battery controlling unit 150 and the vehicle controlling unit 200 are connected to a communication network in a vehicle referred to as CAN (Controller Area Network) and can transmit/receive information to each other via this.

The vehicle controlling unit 200 controls the inverter 400, which is connected to the battery system 100 via the relays 300 and 310, by using the information transmitted from the assembled-battery controlling unit 150. During driving of the vehicle, the battery system 100 is connected to the inverter 400. The inverter 400 drives a motor generator 410 by using energy assembled in the assembled battery 110 in the battery system 100.

When a vehicle system in which the battery system 100 is mounted is to be started and driven, the battery system 100 is connected to the inverter 400 under management of the vehicle controlling unit 200. Then, the vehicle controlling unit 200 is driven by the inverter 400 by using the energy stored in the assembled battery 110. On the other hand, in a case of regeneration, the assembled battery 110 is charged by the generated electric power of the motor generator 410.

When the battery system 100 is connected to the charger 420 via the relays 320 and 330, the assembled battery 110 is charged by a charge current supplied from the charger 420 until predetermined conditions are satisfied. The energy stored in the assembled battery 110 by charging is utilized in next driving of the vehicle and also utilized for operating electric components, etc. in and outside the vehicle. Furthermore, in accordance with needs, the energy is released to an external electric power source typified by a home-use electric power source in some cases. Note that the charger 420 is mounted in an external electric power source typified by a home-use electric power source or an electric desk lamp. When a vehicle in which the battery system 100 is mounted is connected to such an electric power source, the battery system 100 and the charger 420 are connected based on information sent from the vehicle controlling unit 200.

Figure 2:
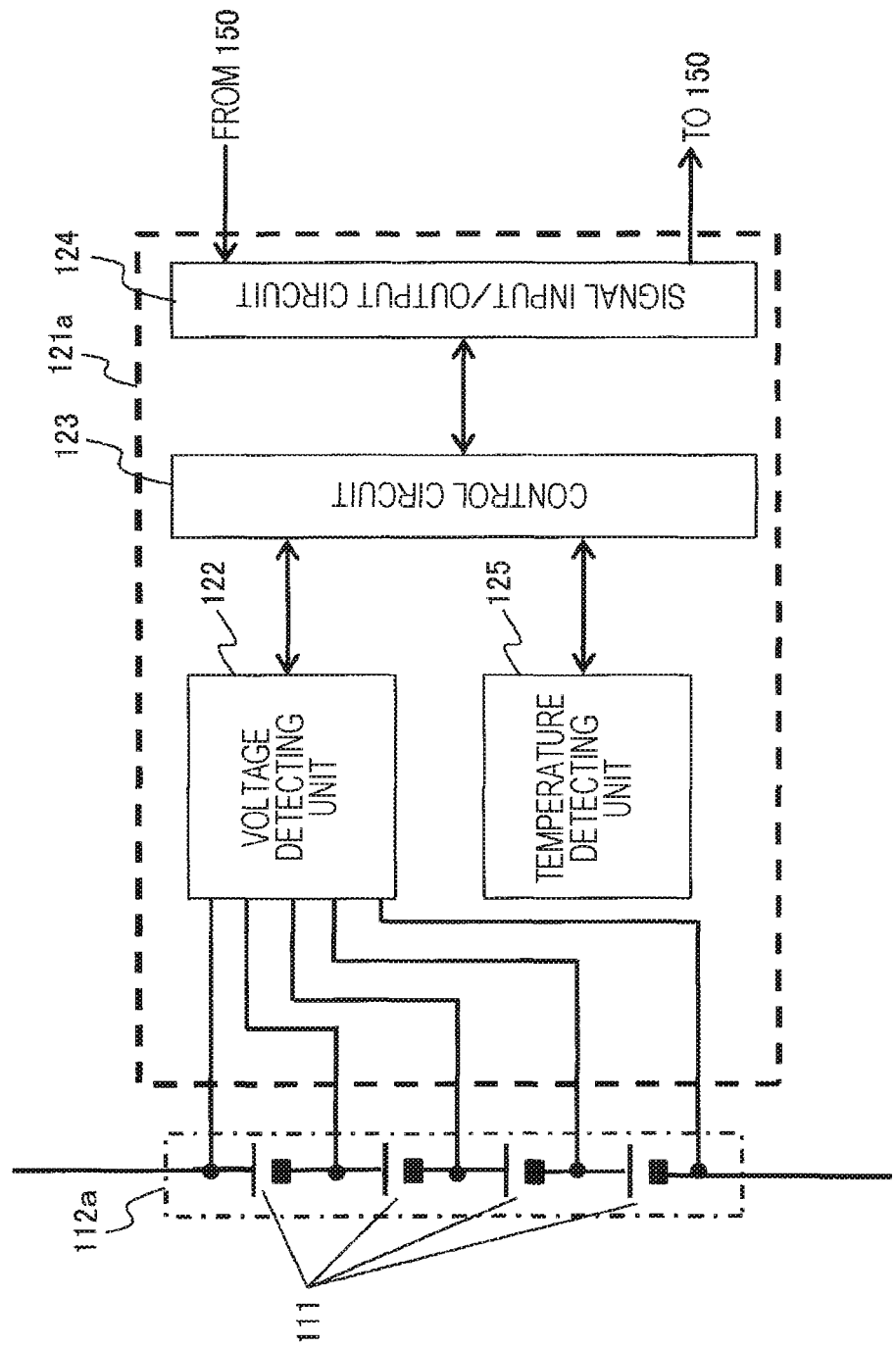
FIG. 2 is a diagram showing a circuit configuration of a single-battery controlling unit.

FIG. 2 is a diagram showing a circuit configuration of the single-battery controlling unit 121a. As shown in FIG. 2, the single-battery controlling unit 121a is provided with a voltage detecting unit 122, a control circuit 123, and a signal input/output circuit 124. Note that the single-battery controlling unit 121a and the single-battery controlling unit 121b of FIG. 1 have similar circuit configurations. Therefore, FIG. 2 shows the circuit configuration of the single-battery controlling unit 121a to represent them.

The voltage detecting unit 122 measures the voltage between terminals of each of the single batteries 111 (both-end voltage). The control circuit 123 receives measurement results from the voltage detecting unit 122 and transmits them to the assembled-battery controlling unit 150 via the signal input/output circuit 124. Note that, although illustration thereof is omitted in FIG. 2, a known circuit configuration for equalizing variations in the voltages and charge levels among the single batteries 111 caused along with, for example, variations in self-discharge and consumed currents is provided in the single-battery controlling unit 121a. This operation of the circuit is controlled by the control circuit 123.

Figure 3:
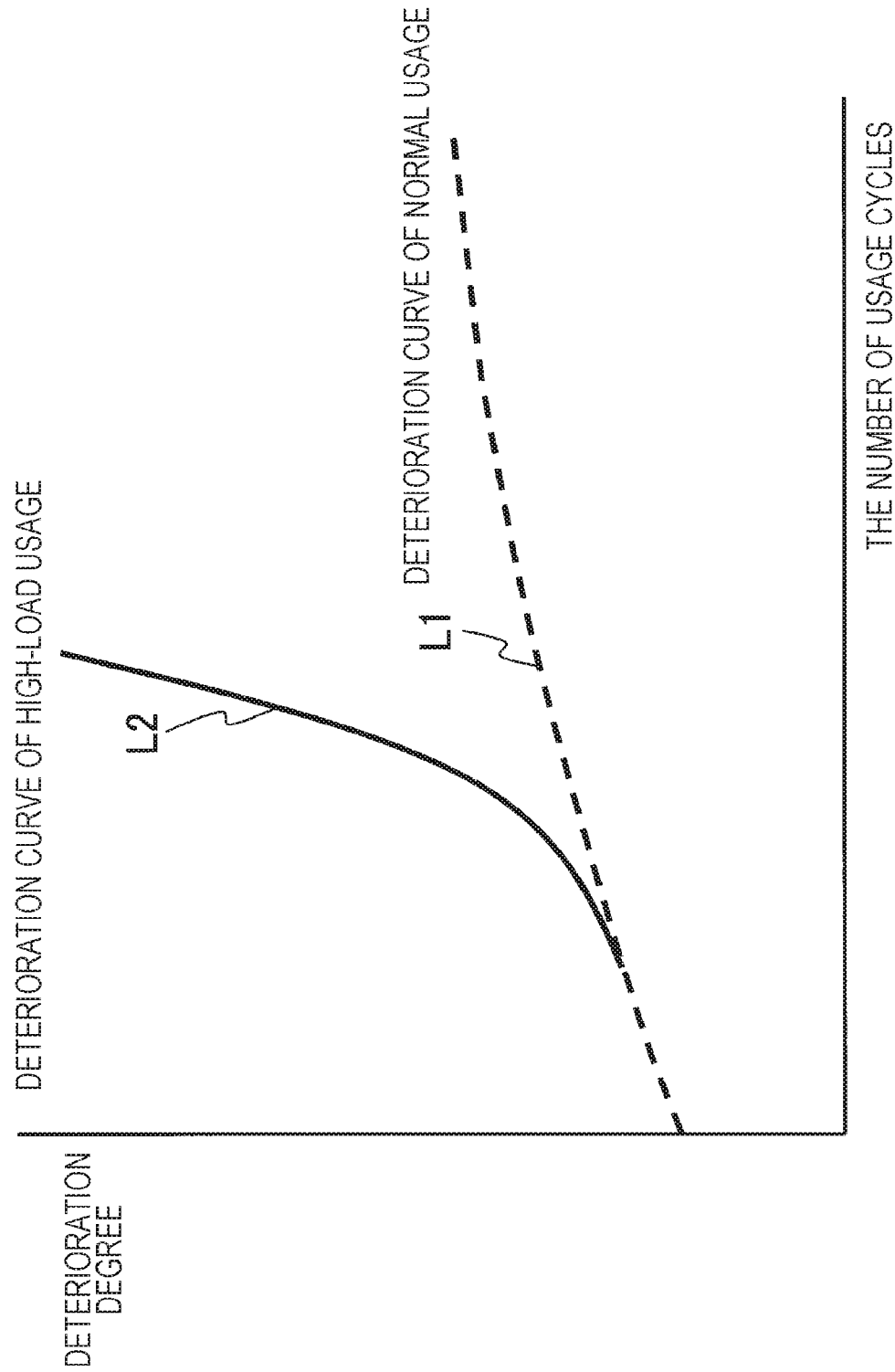
FIG. 3 is a diagram showing the relation between the number of usage cycles and the deterioration degree of a battery.

FIG. 3 is a diagram showing an example of the relation between the number of usage cycles of the secondary battery and the deterioration degree of the secondary battery. A horizontal axis of this diagram represents the number of usage cycles, and a vertical axis represents the deterioration degree. As shown by a broken line L1 in FIG. 3, in normal usage in which the effective current is equal to or less than the permissible value, the deterioration of the battery gradually progresses as the number of usage cycles of the battery is increased. On the other hand, as shown by a solid line L2 in FIG. 3, in long-period usage with a high load exceeding the permissible value of the battery, the value of the internal resistance is temporarily increased (high-load resistance increase) as the number of usage cycles of the battery is increased, and deterioration of the battery rapidly progresses. In such a case, the performance of the battery cannot be fully exerted.

Note that the effective current is a root mean square of the current value and is defined by following Expression 1.

[Mathematical Expression 1]

$$\text{effective current} = \sqrt{\frac{\sum_{t=a}^{b}(I_t)^2}{(b-a)}} \quad \text{Expression 1}$$

Herein, "It" represents a current value at a certain time point "t", and "b−a" represents the number of data pieces from a certain time point "a" to a certain time point "b". The time width from acquisition of data "a" to acquisition of data "b" will be hereinafter referred to as a time window. If data is acquired every 1 second, "b−a" second is the time window; and, if data is acquired every 0.1 second, "(b−a)× 0.1" second is the time window.

Meanwhile, the permissible value is the effective current of each time window for which a characteristic evaluation of the battery has been carried out in advance and it has been confirmed that the high-load resistance increase shown by the solid line L2 of FIG. 3 does not occur, and the permissible value is obtained by an experiment in advance. In the present embodiment, charge/discharge restriction with respect to the assembled battery 110 is carried out so that the effective current is equal to or less than the permissible value.

Figure 4:
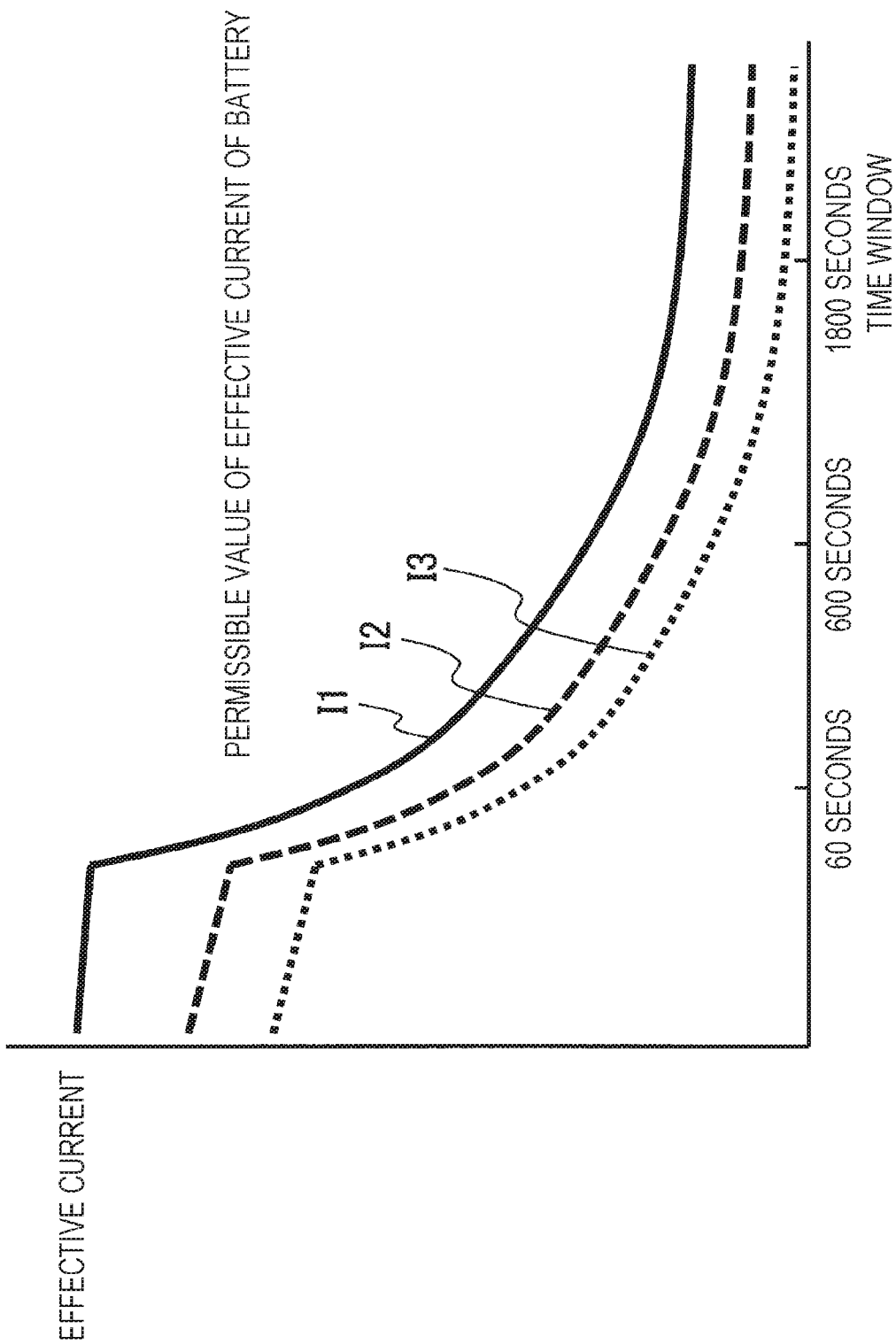
FIG. 4 is a diagram showing the relation between permissible values of effective currents of the battery and time windows.

FIG. 4 is a diagram showing an example of the relation between the time window of the effective current and the permissible value depending on the temperature of the battery. A horizontal axis of the diagram represents the time window and is expressed by logarithms, and a vertical axis represents the effective current. FIG. 4 is a graph of permissible values I1 to I3 for avoiding occurrence of the high-load resistance increase. The graph of the permissible value I1 represents the permissible value of the effective current of the battery in the case in which the battery temperature is high. The graph of the permissible value I2 shows a case in which the battery temperature is intermediate, and the graph of the permissible value I3 represents permissible value of the effective current of the battery in the case in which the battery temperature is low. These permissible values have been obtained by experimenting the values that avoid occurrence of the high-load resistance increase for each time window.

As shown in FIG. 4, the permissible value of the effective current of the battery is changed depending on the time window for calculating the effective current of the battery. The longer the time window for calculating the effective current, the more easily deterioration of the battery progresses during that period, and, therefore, the permissible value has to be set to be low. Therefore, it is preferred that the permissible values be judged not only by a short time window, but by combining a plurality of time windows which are long by some degree such as 60 seconds, 600 seconds, and 1800 seconds. Meanwhile, if an excessively long time window such as 3 hours or more is set, sufficient effects cannot be exerted. If charge/discharge is carried out by the same effective current, battery deterioration more easily progresses as the battery temperature gets lower, and, therefore, the permissible value has to be set to be low.

Figure 5:
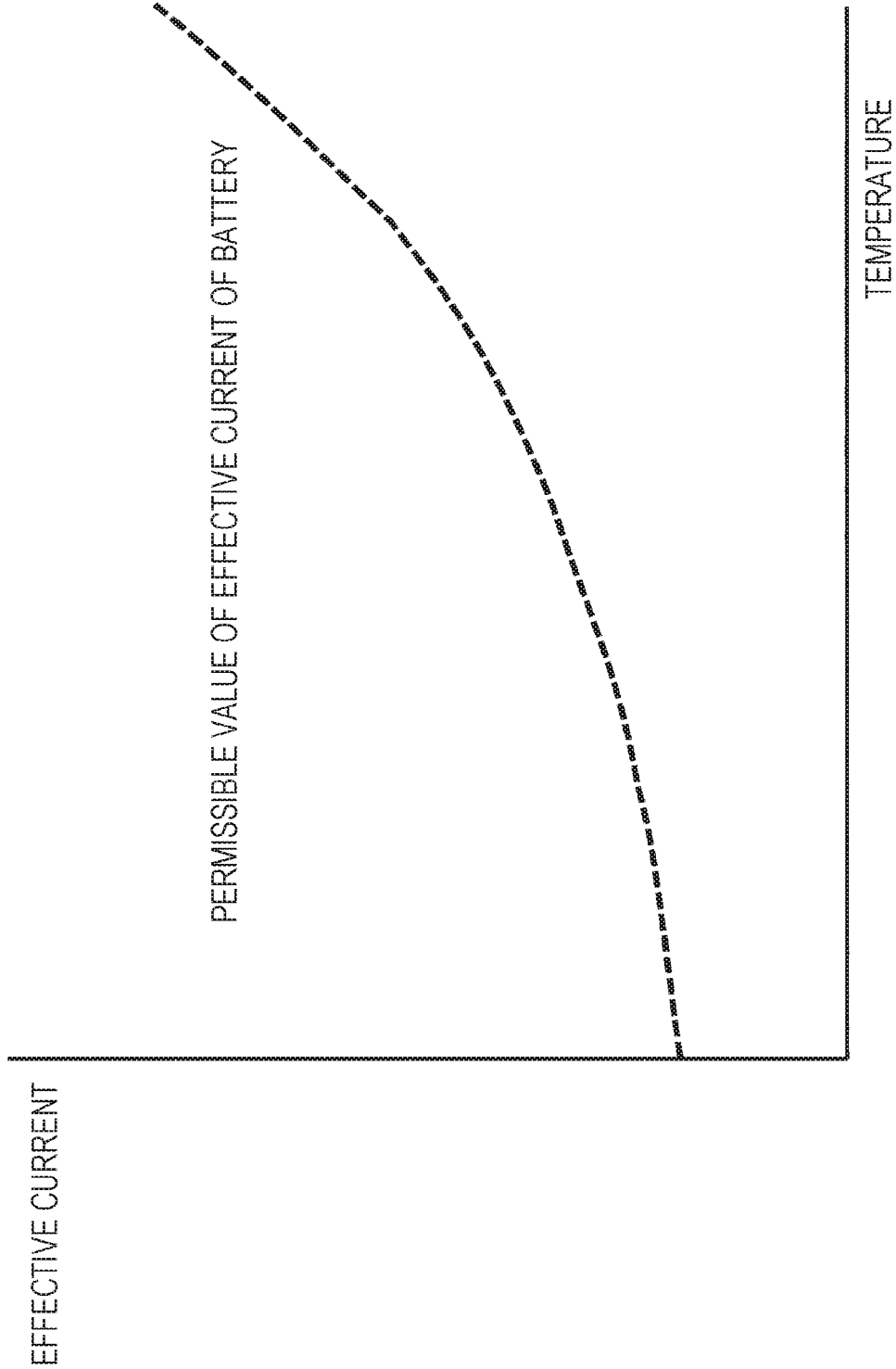
FIG. 5 is a diagram showing the relation between the temperature of the battery and the permissible values of the effective currents.

FIG. 5 is a diagram showing an example of the relation between the temperature of the battery and the permissible value of the effective current. A horizontal axis of this diagram represents the temperature, and a vertical axis represents the effective current. This FIG. 5 shows the relation between the permissible value of the effective current and the temperature in a certain particular time window in the graph of FIG. 4. According to FIG. 5, it can be understood that, if the temperature increases, the permissible value for avoiding occurrence of the high-load resistance increase has to be increased. The temperature of the battery for an automobile is largely changed depending on heat generation caused long with charge/discharge, changes of a cooling wind supplied to the battery, etc. Regarding the temperature of the battery, there are problems, for example, that distributions of temperatures occur in a battery pack and that, in the first place, it is difficult to measure the temperature in the battery. The permissible value is largely changed depending on the temperature. Therefore, due to a difference between an actual temperature and a measured temperature, unnecessary charge/discharge restriction may be carried out, and the high-load resistance increase may be caused since appropriate charge/discharge restriction cannot be carried out. Therefore, it is desired to set a new index which has a small change of the permissible value even when the temperature is changed.

As a result of studies, it was found out that, when the product of the current value which avoids occurrence of the high-load resistance increase and DCR (Direct Current Resistance) was used as an index, changes in the permissible value were small even when the temperature was changed. Herein, in a case in which each of the effective current and DCR is calculated and the product thereof is obtained, precise temperature measurement is required since DCR is largely changed depending on temperature changes. However, the product of the effective current and DCR corresponds to the difference between the closed-circuit voltage of the secondary battery and the open-circuit voltage of the secondary battery. Therefore, an index value which does not use the temperature as a parameter can be obtained by directly measuring the voltage of the secondary battery and obtaining the difference between the closed-circuit voltage and the open-circuit voltage.

Figure 6:
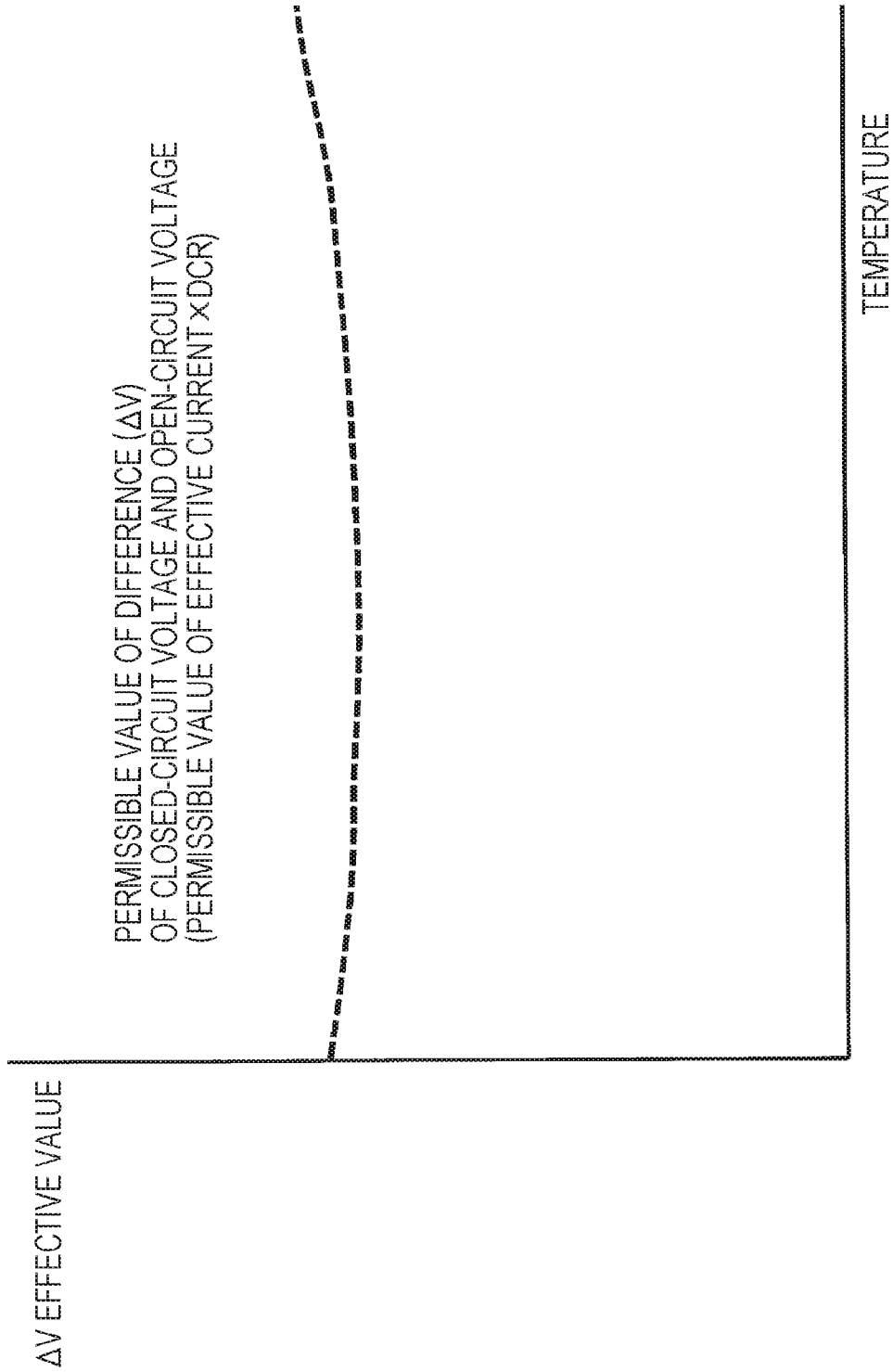
FIG. 6 is a diagram showing the relation between the temperature of the battery and effective values of the difference between a closed-circuit voltage and an open-circuit voltage.

FIG. 6 is a diagram showing an example of the relation between the temperature of the battery and the effective value of the difference between the closed-circuit voltage and the open-circuit voltage. A horizontal axis of this diagram presents the temperature, and a vertical axis represents $\Delta V$ effective values. The $\Delta V$ effective value is expressed by following Expression 2.

[Mathematical Expression 2]

$$\Delta V \text{ effective value} = \sqrt{\frac{\sum_{t=a}^{b}[CCV_t - OCV_t]^2}{(b-a)}} \quad \text{Expression 2}$$

Herein, CCVt represents the closed-circuit voltage at time "t", and OCVt represents the open-circuit voltage at the time "t". "b–a" represents the number of data pieces from a certain time point "a" to a certain time point "b". If data is acquired every 1 second, "b–a" second is the time window; and, if data is acquired every 0.1 second, "(b–a)×0.1" second is the time window. As shown in FIG. 6, the effective value of the difference between the closed-circuit voltage and the open-circuit voltage has small changes with respect to the temperature changes of the secondary battery, and this can be set as the new index value with which changes in the permissible value are small even when the temperature is changed.

Figure 7:
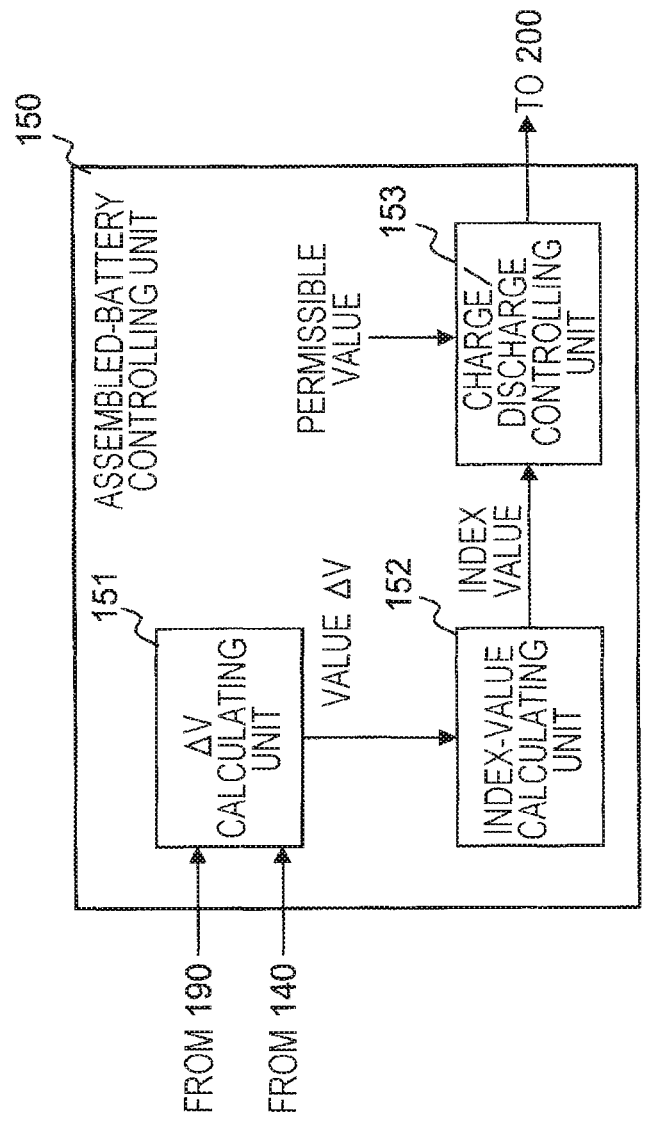
FIG. 7 is a diagram showing functional blocks of an assembled-battery controlling unit about charge/discharge restriction.

FIG. 7 is a diagram showing functional blocks of the assembled-battery controlling unit 150 about the charge/discharge restriction. The assembled-battery controlling unit 150 has functional blocks, i.e., a $\Delta V$ calculating unit 151 (difference calculating unit of the closed-circuit voltage and the open-circuit voltage), an index-value calculating unit 152, and a charge/discharge restricting unit 153 as a configuration for carrying out the charge/discharge restriction of the assembled battery 110.

The closed-circuit voltage of the assembled battery 110 measured by the voltage detecting unit 140 and the open-circuit voltage from the open-circuit-voltage computing unit 190 are always input to the $\Delta V$ calculating unit 151, and the voltage difference between the closed-circuit voltage and the open-circuit voltage in a certain period such as 60 seconds, 600 seconds, 1800 seconds, etc. is calculated.

The index-value calculating unit 152 computes an effective value from the voltage difference in the certain period, which is calculated by the $\Delta V$ calculating unit 151, based on Expression 2, thereby obtaining an index value. It is not limited to the effective value, and an index value may be obtained by computing a mean square value, a mean value, first-order lag processing, etc. based on the voltage difference in the certain period calculated by the $\Delta V$ calculating unit 151.

The mean square value can be computed by Expression 3, the mean value can be computed by Expression 4, and the first-order lag processing of the effective value in a case in which data is acquired every 0.1 second can be computed by Expression 5. In following expressions, CCVt represents the closed-circuit voltage at time "t", and OCVt represents the open-circuit voltage at the time "t". Also, "b–a" represents the number of data pieces from a certain time point "a" to a certain time point "b".

[Mathematical Expression 3]

$$\text{mean square value} = \frac{\sum_{t=a}^{b}[CCV_t - OCV_t]^2}{(b-a)} \quad \text{Expression 3}$$

[Mathematical Expression 4]

$$\text{mean value} = \frac{\sum_{t=a}^{b}|CCV_t - OCV_t|}{(b-a)} \quad \text{Expression 4}$$

[Mathematical Expression 5]

$$X(n) = (CCV - OCV)^2 \quad \text{Expression 5}$$
$$Y(n) = X(n)*0.1\ \text{second}/\tau + Y(n-1)*(1-0.1\ \text{second}/\tau)$$
$$\Delta V\ \text{effective value}\ (\tau) = \sqrt{Y(n)}$$

Herein, τ is a time constant (second) Note that, in Expression 5, the first-order lag processing of the effective value of the case in which data is acquired every 0.1 second is taken as an example. However, even if the frequency of data acquisition is changed and/or even if the effective value is changed to a mean square value or a mean value, similar processing can be carried out.

The charge/discharge restricting unit 153 compares the index value output from the index-value calculating unit 152 with the permissible value and determines whether the charge/discharge current of the assembled battery 110 should be restricted or not. Regarding the permissible value, if the index value is the ΔV effective value, the permissible value corresponding to the effective value is stored in the storage unit 180 in advance based on results of, for example, experiments. If the index value is a mean square value, mean value, first-order lag processing, or the like, the permissible value corresponding thereto is stored in the storage unit 180 in advance based on results of, for example, experiments. Then, the charge/discharge restricting unit 153 reads the permissible value corresponding to the computation form of the index value from the storage unit 180 and compares that with the index value. Then, if the index value is exceeding the permissible value, it is determined that the charge/discharge current should be restricted, the value of the permissible electric power after the restriction is determined, and a signal for causing the vehicle controlling unit 200, etc. to restrict the charge/discharge current is output.

In charging, the assembled battery 110 is charged by the generated electric power of the motor generator 410; however, the vehicle controlling unit 200 reduces a charge current by controlling the inverter 400 so as to reduce the amount of the energy allocated to charging of the assembled battery 110. Also, in discharging, a discharge current is reduced by controlling the inverter 400 so as to increase the energy rate of the engine side of the vehicle and reduce the driving electric power of the motor generator 410. As a result, the charge/discharge current can be reduced by carrying out charge/discharge restriction with respect to the assembled battery 110. Then, when the charge/discharge current is reduced, the voltage difference between the closed-circuit voltage and the open-circuit voltage is also reduced, and the index value which is the computation result based on the voltage difference between the closed-circuit voltage and the open-circuit voltage is also reduced.

By the functional blocks described above, the assembled-battery controlling unit 150 can carry out the charge/discharge restriction with respect to the assembled battery 110.

Figure 8:
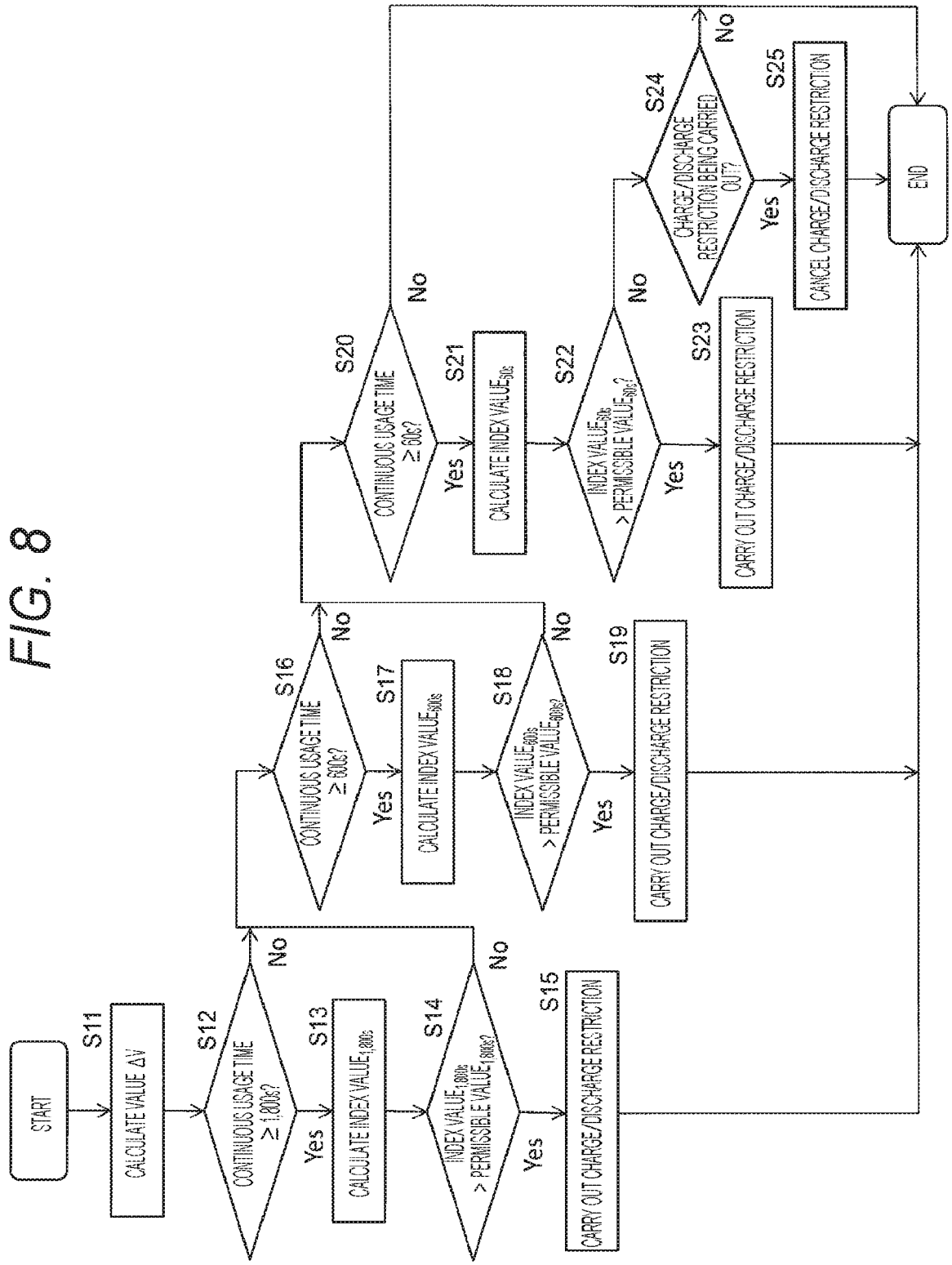
FIG. 8 is a flow chart for charge/discharge restriction by the assembled-battery controlling unit.

FIG. 8 is a flow chart showing processes of a case in which a function equivalent to the charge/discharge restriction by the functional block shown in FIG. 7 is executed by a microcomputer in the assembled-battery controlling unit 150. The process shown in this flow chart is executed in every predetermined process cycle in the assembled-battery controlling unit 150. Meanwhile, a controller of the processes shown in the flow chart is the assembled-battery controlling unit 150.

In step S11, the assembled-battery controlling unit 150 acquires an open-circuit voltage from the open-circuit-voltage computing unit 190, acquires a closed-circuit voltage from the voltage detecting unit 140, and is always calculating the difference between the closed-circuit voltage and the open-circuit voltage. Specifically, the difference between the closed-circuit voltage and the open-circuit voltage is calculated for each of the time windows 1800 seconds, 600 seconds, and 60 seconds and is stored in the storage unit 180, and the values thereof are used in later-described calculations of index values. Note that the difference between the closed-circuit voltage and the open-circuit voltage is effective to a certain extent even when it is calculated by the total voltage of the assembled battery. However, it is preferred to calculate the difference for each single battery and use the value of the single battery having a large difference between the closed-circuit voltage and the open-circuit voltage. A reason therefor is that, regarding deterioration of the batteries, deterioration is not uniform due to the influence of individual differences of the batteries, disposition in the battery pack, etc., and the high-load resistance increase can be reliably avoided by restricting charge/discharge by the characteristics of the most deteriorated battery, in other words, the single battery having the large difference between the closed-circuit voltage and the open-circuit voltage. Specifically, if the largest computed value among the computed values of the plurality of single batteries computed based on the difference between the closed-circuit voltage and the open-circuit voltage is exceeding the permissible value determined in advance, the charge/discharge restriction of the secondary battery is carried out.

In step S12, whether the continuous usage time by which the difference between the closed-circuit voltage and the open-circuit voltage is calculated in step S11 is equal to or more than 1800 seconds or not is discriminated. If it is equal to or more than 1800 seconds, the process proceeds to step S13; and, if it is less than 1800 seconds, the process proceeds to step S16.

In step S13, the index value of the 1800 seconds is calculated. In a case in which the index value is expressed by the ΔV effective value, the index value is calculated by using Expression 2. More specifically, the ΔV effective value is calculated as the index value based on the summation of the differences between the closed-circuit voltage CCV and the open-circuit voltages OCV to the power of 2 accumulated during the 1800 seconds and based on the time window.

In next step S14, the calculated index value of the 1800 seconds and the permissible value of 1800 seconds obtained in advance by, for example, experiments are compared with each other. The permissible value of 1800 seconds is stored in advance in the storage unit 180. If the calculated index value of the 1800 seconds is exceeding the permissible value of the 1800 seconds, the process proceeds to step S15; and, if not exceeding, the process proceeds to step S16.

In step S15, the charge/discharge current is restricted so as not to exceed the permissible value of the 1800 seconds. More specifically, the value of permissible electric power after the restriction is determined, and a signal for causing the vehicle controlling unit 200, etc. to carry out restriction of the charge/discharge current is output. In charging, the assembled battery 110 is charged by the generated electric power of the motor generator 410; however, the vehicle controlling unit 200 reduces a charge current by controlling the inverter 400 so as to reduce the amount of the energy allocated to charging of the assembled battery 110. Also, in discharging, a discharge current is reduced by controlling the inverter 400 so as to increase the energy rate of the engine side of the vehicle and reduce the driving electric power of the motor generator 410. As a result, the charge/discharge current can be reduced by carrying out charge/discharge restriction with respect to the assembled battery 110. Then, when the charge/discharge current is reduced, the voltage difference between the closed-circuit voltage and the open-circuit voltage is also reduced, and the index value which is the computation result based on the voltage difference between the closed-circuit voltage and the open-circuit voltage is also reduced. After this restriction of the charge/discharge current is carried out, the process shown in the flow chart is terminated.

In step S16, whether the continuous usage time by which the difference between the closed-circuit voltage and the open-circuit voltage is calculated in step S11 is equal to or more than 600 seconds or not is discriminated. If it is equal to or more than 600 seconds, the process proceeds to step S17; and, if it is less than 600 seconds, the process proceeds to step S20.

In step S17, the index value of 600 seconds is calculated and is compared with the permissible value of 600 seconds in step S18. If the calculated index value of the 600 seconds is exceeding the permissible value of the 600 seconds, the process proceeds to step S19; and, if not exceeding, the process proceeds to step S20.

In step S19, the charge/discharge current is restricted so as not to exceed the permissible value of the 600 seconds. A specific process thereof is similar to that of step 15. After this restriction of the charge/discharge current is carried out, the process shown in the flow chart is terminated.

In step S20, whether the continuous usage time by which the difference between the closed-circuit voltage and the open-circuit voltage is calculated in step S11 is equal to or more than 60 seconds or not is discriminated. If it is equal to or more than 60 seconds, the process proceeds to step S21; and, if it is less than 60 seconds, the process shown in the flow chart is terminated.

In step S21, the index value of 60 seconds is calculated and is compared with the permissible value of 60 seconds in step S22. If the calculated index value of the 60 seconds is exceeding the permissible value of the 60 seconds, the process proceeds to step S23; and, if not exceeding, the process proceeds to step S24.

In step S23, the charge/discharge current is restricted so as not to exceed the permissible value of the 60 seconds. A specific process thereof is similar to that of step 15. After this restriction of the charge/discharge current is carried out, the process shown in the flow chart is terminated.

In step S24, whether the charge/discharge restriction is being carried out or not is discriminated. If the charge/discharge restriction is being carried out, the process proceeds to next step S25, and the charge/discharge restriction is cancelled. In this case, the assembled-battery controlling unit 150 outputs a signal, which cancels the charge/discharge restriction, to the vehicle controlling unit 200 immediately or after a certain period of time.

Note that the charge/discharge restriction may be cancelled after a certain period elapses after the charge/discharge restriction is carried out. If the charge/discharge restriction is not being carried out in step S24, the process shown in the flow chart is terminated.

In the above flow chart, if the continuous usage time by which the difference between the closed-circuit voltage and the open-circuit voltage is calculated becomes 1800 seconds or more, the calculation of the difference between the closed-circuit voltage and the open-circuit voltage is sequentially carried out again from the continuous usage time of 0 second. In other words, the difference between the closed-circuit voltage and the open-circuit voltage is always calculated in step S11 until the continuous usage time becomes 60 seconds or more. If the continuous usage time becomes 60 seconds or more, the index value of 60 seconds is calculated in step S21. Hereinafter, similarly, when the continuous usage time becomes 600 seconds or more and when the continuous usage time becomes 1800 seconds or more, the respective index values are calculated in steps S17 and S13, respectively.

The above flow chart has been described by the example in which the ΔV effective value calculated by using Expression 2 is used as the index value. However, the mean square value calculated by using Expression 3, the mean value calculated by using Expression 4, or the first-order lag processing calculated by using Expression 5 may be used as the index value.

Moreover, in the above flow chart, a maximum of the time window is 1800 seconds, and whether the index value has exceeded the permissible value or not is discriminated when the time window is 60 seconds or more or 600 seconds or more. Therefore, the charge/discharge restriction can be carried out when the index value exceeds the permissible value in any of the time windows. Note that the time windows have been described by the examples of 1800 seconds, 600 seconds, and 60 seconds, but may be other than these.

The charge/discharge restriction can be carried out with respect to the assembled battery 110 by executing the process as described above by the assembled-battery controlling unit 150.

According to the above described embodiment, following working effects are obtained.

(1) A battery controlling device includes: a voltage detecting unit 140 configured to detect a closed-circuit voltage of a secondary battery; an open-circuit-voltage computing unit 190 configured to compute an open-circuit voltage of the secondary battery; and an assembled-battery controlling unit 150 configured to discriminate whether a computed value computed based on a voltage difference between the closed-circuit voltage and the open-circuit voltage of the secondary battery in a continuous predetermined period is exceeding a permissible value determined in advance or not, wherein, if the computed value is exceeding the permissible value determined in advance, the assembled-battery controlling unit 150 outputs a signal that carries out charge/discharge restriction of the secondary battery. Therefore, since the voltage difference between the closed-circuit voltage and the open-circuit voltage does not have temperature dependency, when the computed value based on the voltage difference is used as a deterioration judge index of the secondary battery, this is suitable in use for a vehicle having a large temperature variation range.

The present invention is not limited to the above described embodiment or modification examples, and it goes without saying that various modifications can be made within the range not departing from the gist thereof. Meanwhile, all or part of the above described configurations and functions may be realized as hardware using, for example, integrated circuits, etc. or may be realized as programs or software executed by a processor. Information such as programs and tables for realizing the functions may be stored in a storage device such as a memory or hard disk.

The disclosure contents of a following priority application are incorporated herein by reference.

Japanese Patent Application No. 2014-139436 (applied on Jul. 7, 2014)

REFERENCE SIGNS LIST 100 battery system
110 assembled battery
111 single battery
120 battery controlling device
130 current detecting unit
140 voltage detecting unit
150 assembled-battery controlling unit
151 ΔV calculating unit
152 index-value calculating unit
153 charge/discharge restricting unit
180 storage unit
190 open-circuit-voltage computing unit
200 vehicle controlling unit
400 inverter
410 motor generator
420 charger

The invention claimed is:

1. A battery controlling device comprising:
a voltage detecting unit configured to detect a closed-circuit voltage of a secondary battery;
an open-circuit-voltage computing unit configured to compute an open-circuit voltage of the secondary battery; and
an assembled-battery controlling unit configured to discriminate whether a computed value computed based on a voltage difference between the closed-circuit voltage and the open-circuit voltage of the secondary battery in a continuous predetermined period is exceeding a permissible value determined in advance or not, wherein
if the computed value is exceeding the permissible value determined in advance, the assembled-battery controlling unit outputs a signal that carries out charge/discharge restriction of the secondary battery.

2. The battery controlling device according to claim 1, wherein
the assembled-battery controlling unit obtains the computed value by carrying out computation based on the voltage difference between the closed-circuit voltage and the open-circuit voltage of the secondary battery in each of at least two types of the continuous predetermined periods, compares the permissible value determined in advance for each of the predetermined periods with each computed value, and, if the computed value is exceeding the permissible value, outputs a signal that carries out charge/discharge restriction of the secondary battery.

3. The battery controlling device according to claim 2, wherein,
if a result of the computation is returned to equal to or less than the permissible value after the signal that carries out the charge/discharge restriction of the secondary battery is output, the assembled-battery controlling unit, immediately or after a certain period of time, outputs a signal that cancels the charge/discharge restriction.

4. The battery controlling device according to claim 1, wherein the computation based on the voltage difference between the closed-circuit voltage and the open-circuit voltage of the secondary battery is an effective value, a mean square value, a mean value, or any of first-order lag processing of the effective value, the mean square value, and the mean value.

5. The battery controlling device according to claim 1, wherein
the assembled-battery controlling unit carries out the computation based on the voltage difference between the closed-circuit voltage and the open-circuit voltage of each of a plurality of single batteries constituting the secondary battery and, if a largest computed value among the plurality of computed values of the plurality of single batteries subjected to the computation is exceeding the permissible value determined in advance, outputs a signal that carries out charge/discharge restriction of the secondary battery.

6. The battery controlling device according to claim 1, further comprising
a storage unit storing, in advance, a relation between a charge level of the secondary battery and the open-circuit voltage as a table or a function, wherein
the assembled-battery controlling unit reads the open-circuit voltage corresponding to the detected charge level from the storage unit and obtains the open-circuit voltage based on the detected charge level.

7. The battery controlling device according to claim 4, wherein
the assembled-battery controlling unit carries out the computation based on the voltage difference between the closed-circuit voltage and the open-circuit voltage of each of a plurality of single batteries constituting the secondary battery and, if a largest computed value among the plurality of computed values of the plurality of single batteries subjected to the computation is exceeding the permissible value determined in advance, outputs a signal that carries out charge/discharge restriction of the secondary battery.

8. The battery controlling device according to claim 4, further comprising
a storage unit storing, in advance, a relation between a charge level of the secondary battery and the open-circuit voltage as a table or a function, wherein
the assembled-battery controlling unit reads the open-circuit voltage corresponding to the detected charge level from the storage unit and obtains the open-circuit voltage based on the detected charge level.

* * * * *